United States Patent [19]

Kokawa et al.

[11] 4,002,478
[45] Jan. 11, 1977

[54] METHOD FOR FORMING RELIEF PATTERN

[75] Inventors: Tomoo Kokawa; Yoshikathu Nakao; Kunio Akiyama, all of Hiratsuka, Japan

[73] Assignee: Kansai Paint Co., Ltd., Japan

[22] Filed: Jan. 2, 1976

[21] Appl. No.: 646,345

Related U.S. Application Data

[63] Continuation-in-part of Ser. No. 451,504, March 15, 1974, abandoned.

[30] Foreign Application Priority Data

Mar. 15, 1973  Japan ............................ 48-29394
Mar. 29, 1973  Japan ............................ 48-35052

[52] U.S. Cl. .................................. 96/38.1; 96/28; 96/35.1; 96/68
[51] Int. Cl.² ................... G03C 5/00; G03C 11/12
[58] Field of Search ........... 96/28, 35.1, 36.2, 38.1, 96/68, 27 R, 38.3, 35, 36

[56] References Cited

UNITED STATES PATENTS

| | | | |
|---|---|---|---|
| 2,480,533 | 4/1961 | Charlton | 96/38.1 |
| 3,060,026 | 10/1962 | Heiart | 96/28 |
| 3,157,505 | 11/1964 | Notley | 96/68 |
| 3,259,499 | 7/1966 | Thommes | 96/115 |
| 3,313,626 | 4/1967 | Whitney | 96/33 |
| 3,615,435 | 10/1971 | Chu et al. | 96/28 |
| 3,652,273 | 3/1972 | Htoo | 96/36 |
| 3,661,576 | 5/1972 | Crary | 96/35.1 |
| 3,770,438 | 11/1973 | Celeste | 96/67 |
| 3,826,650 | 7/1974 | Schlesinger | 96/35.1 |
| 3,891,441 | 6/1975 | Tsuji et al. | 96/68 |

*Primary Examiner*—Edward C. Kimlin
*Attorney, Agent, or Firm*—Ostrolenk, Faber, Gerb & Soffen

[57] ABSTRACT

A method for forming a relief pattern on a substrate which comprises the steps of: (I) allowing a photosensitive sheet to adhere on said substrate, said photosensitive sheet containing a photo-impervious ink layer, releasing layer, pattern forming layer and photosensitive resin layer; (II) radiating actinic rays on said photosensitive sheet to cure an irradiated portion of said photosensitive resin layer; (III) peeling off the upper layers of said photosensitive sheet; and (IV) washing away the un-cured portion of said photosensitive resin layer to produce a fine and decorative relief pattern.

11 Claims, 5 Drawing Figures

METHOD FOR FORMING RELIEF PATTERN

This application is a continuation-in-part of application Ser. No. 451,504, now abandoned, filed on Mar. 15, 1974.

BACKGROUND OF THE INVENTION

This invention relates to a method for forming relief patterns by using a photosensitive sheet. More particularly, the invention relates to an improved method for forming relief patterns on the surfaces of substrates or articles such as interior panels, personal ornaments and various other kinds of goods. Further, the invention relates to such method for forming colored relief patterns which is characterized by the steps of: (I) allowing the photosensitive sheet consisting of below-mentioned materials to adhere on a substrate under pressure, (II) applying actinic rays to said photosensitive sheet to cure predetermined portions of a pattern forming layer and a photosensitive resin layer of said photosensitive sheet, (III) peeling off the layers other than said pattern forming layer and photosensitive resin layer from the substrate, and (IV) washing off the uncured portions of said photosensitive resin layer from substrate by using a washing solution, thereby forming relief patterns on the substrate.

In the conventional method for forming patterns by using sheet materials, various kinds of decalcomanias are used. The patterns formed by decalcomanias are, however, simply plane wthout relief. In addition, the patterns are deficient in chemical and physical durability. Further, the range of their use is rather narrow, because they cannot be used when, for instance, light resistance is required. The term "pattern" as used in the present specification includes letters, marks, lines, figures, photograhic images, pictures, drawings and so forth.

BRIEF SUMMARY OF THE INVENTION

As the result of extensive study on the elimination of the above-mentioned drawbacks in the pattern formation, the inventors of the present invention have accomplished a novel and improved method as disclosed in the following.

Accordingly, the principal object of the present invention is to provide an imroved method for forming patterns in which the various disadvantages in the prior art are eliminated. Another object of the present invention is to provide a method for forming relief patterns which is applicable to a great variety of articles. A further object of the present invention is to provide a method for forming relief patterns which are finely decorative and durable. A still further object of the present invention is to provide a method for forming relief patterns which can be carried out without any difficulty in the commercial production processes.

Pursuant to the above-mentioned objects, the method of the present invention for forming relief patterns is carried out by using a photosensitive sheet which comprises: (A) a photo-pervious base film made of photo-pervious plastic film or cellulose derivative film, (B) a photo-impervious ink layer formed by printing the portions of said base film other than the predetermined pattern portions, thereby forming photo-impervious portions, (C) a releasing layer applied to all of one side surface of said base film, (D) a pattern forming layer formed by one or more photocurable coloring inks applied to the remaining photo-pervious portions of said base film, and (E) a photosensitive resin layer which consists of photosensitive resin and photosensitizer, and if necessary, coloring pigments.

In one embodiment of the present invention, said (A) photo-pervious base film, (B) photo-impervious ink layer, (C) releasing layer, (D) pattern forming layer and (E) photosensitive resin layer are put together in layers to form a photosensitive sheet. In another embodiment of the invention, said (A) photo-pervious base film, (B) photo-impervious ink layer, (C) releasing layer (D) (C) pattern forming layer are put together in layers to form said photosensitive sheet, while said (E) photosensitive resin layer is previously applied to the surface of a substrate to be provided with the pattern.

According to the method of the present invention, the above-mentioned photosensitive sheet is allowed to adhere on the surface of a substrate under pressure. When the latter-mentioned photosensitive sheet without the photosensitive resin layer is used, the surface of said substrate may be previously provided with the photosensitive resin layer. Thereafter, the photosensitive sheet on the substrate is irradiated by actinic rays to cause photo-curing of the pattern portion, and the upper layers of (A) photo-pervious base film, (B) photo-impervious ink layer and (C) releasing layer are then peeled off from the substrate. Further, the remaining un-cured (E) photosensitive resin layer is washed away by a washing solution to leave the cured photosensitive resin layer and pattern forming layer on the substrate. Thereby, the relief pattern of the present invention can be formed.

BRIEF DESCRIPTION OF THE DRAWINGS

These and other objects and features of the present invention will become more apparent from the following description taken in connection with the accompanying drawings in which.

DETAILED DESCRIPTION OF THE INVENTION

Figure 1:
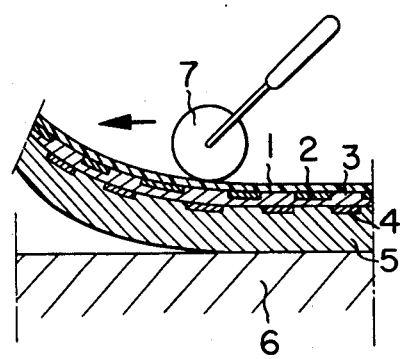
FIG. 1 to FIG. 4 are schematic cross-sectional views of a photosensitive sheet and a substrate showing one process of the present invention.
Figure 2:
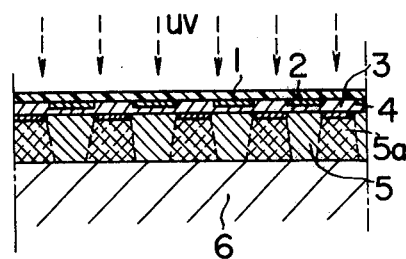
Figure 3:
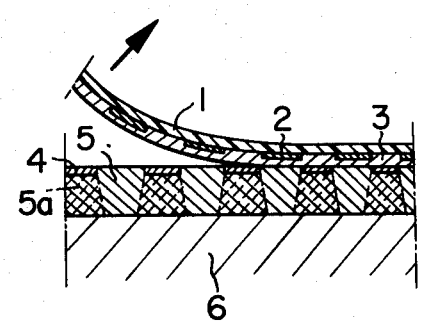
Figure 4:
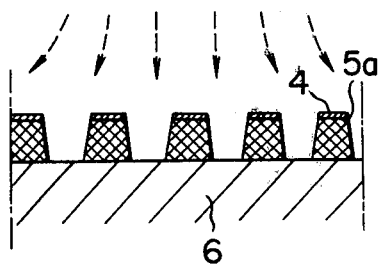

The foregoing base film used for the photosensitive sheet of the present invention is photo-pervious, and it may be made of transparent plastic film or cellulose derivative film and in addition, it should have affinity to the above-mentioned photo-impervious ink. As such films, there are, for example, polypropylene, polyethylene, polyester, polystyrene and polycarbonate films as the plastic films, and nitrocellulose and cellulose triacetate films as the cellulose derivative films. In order to improve the adhesion to the photo-impervious ink layer, these films are preferably pretreated by a surface treating solution or corona discharge. If dimensional stability, or flexibility or expansibility is required in use, any proper film may be selected according to the requirement of the use. Further, the thickness of the film may be preferably in the range of about 20 to 200 $\mu$. If the thickness of the film is less than 20 $\mu$, the mechanical strength of the film becomes low, and if the thickness of the film is more than 200 $\mu$, the photo-perviousness of the film is reduced.

The photo-impervious ink layer of the photosensitive sheet of the present invention may be formed on the portions other than the desired pattern portion in like manner as formation of the negative image in the conventional printing method using photo-impervious inks. It is not necessary that the ink used be completely opaque, however, the transmitted light through the photo-impervious ink layer may be less than 1 percent against the incident light, that is to say, a value of 2 or more in the so-called negative density. The negative density (D) is defined as follows: $D = \log_{10}(I_0/I)$, wherein $I_0$ is an amount of the incident light and $I$ is an amount of the transmitted light. As the photo-impervious ink, there are, for example, oil ink obtained by dispersing a pigment into linseed oil varnish, safflower oil varnish or perilla oil varnish, resin type ink mainly comprising pigment and vehicle obtained by dissolving oil-soluble phenolic resin into drying oil such as linseed oil and tung oil, and gravure or flexographic ink mainly comprising pigment and lacquer type varnish obtained by dissolving cellulose derivatives such as nitrocellulose and ethylcellulose, natural or synthetic resin such as shellac, copal, ester gum, acrylic resin, phenolic resin and polyamide resin into an organic solvent such as ethyl alcohol, propyl alcohol, ethyl acetate, methyl ethyl ketone and toluene. Although the kind of the ink is not restricted so long as it is photo-impervious, a black oil ink is in general employed.

The releasing layer of the photosensitive sheet of the present invention is preferably soluble in a weak alkaline washing solution, because the releasing layer sometimes remains on the photosenstive resin layer when the upper layers of the photosensitive sheet are peeled off, and the remained releasing layer must be washed away together with the un-cured photosensitive resin layer. Accordingly, proteins such as casein and gelatine, cellulose derivatives such as carboxymethyl cellulose and cellulose acetate phthalate, and polymers such as polyvinyl alcohol are suitable as the materials for said releasing layer. Further, if necessary, silicone resin may be added to said compounds. This releasing layer may be formed on the above-mentioned photo-impervious ink layer, and the thickness of the releasing layer may be about 1 to 5$\mu$. With regard to the application of the releasing layer, any conventional coating method in the coating industry can be employed. In the method of the present invention, the substrate is applied with said photosensitive sheet of photo-pervious base film, photo-impervious ink layer, releasing layer, pattern forming layer and photosenstive resin layer, and the latter two layers are cured by actinic rays, and then the upper photo-pervious base film and photo-impervious ink layer can be peeled off from the cured resin layer by the existence of this releasing layer.

The coloring ink used for the pattern forming layer of the photosensitive sheet of the present invention is not necessarily photocurable, but is pervious to some extent to the actinic rays. With a view to the weather resistance, solvent resistance, chemical resistance and mechanical resistance, however, it is preferable that the coloring ink is photo-curable. Further, in the printing process, if the registering of this pattern forming layer with the negative pattern of said photo-impervious ink layer is difficult, the pattern forming layer is printed as somewhat larger than the actual pattern form. In such case, the peripheral portions of the pattern forming layer remain on the un-cured portions of the photosensitive resin layer after the peeling of the upper layers. Therefore, it is desirable that the coloring ink for the pattern forming layer is alkali-soluble just like the photosenstive resin layer. This photo-curable coloring ink can be prepared by adding several coloring pigments and photosensitizers to the below-mentioned photo-curable resins. The compounding ratio of said coloring pigment may be determined such that the hiding power of this printed pattern forming layer as represented by the negative density is in the range of about 0.5 to 1.5. In case this density is less than 0.5, a desirable coloring effect cannot be expected, and if this density is more than 1.5, the amount of transmitted light for the curing of photosensitive resin layer is very much decreased so that the curing of said photosensitive resin layer becomes insufficient to provide undesirable relief pattern. In the formation of said pattern forming layer, the above-mentioned photo-curable coloring ink is printed to the surface of combined sheet of said base film, photo-impervious ink layer and releasing layer by means of the conventional printing method such as photo-gravure printing, relief printing or offset printing, thereby forming a printed layer of usual thickness. The thickness of the printed layer is restricted only by the transparency of the layer itself, and any other factors have no relation to the thickness of this pattern forming layer.

As for the above-mentioned photosensitive resins used for the photo-curable coloring ink, well known resins such as polyvinyl alcohol-cinnamic ester, acrylic resin-cinnamic ester, acrylate resin, polyamide resin, diazo resin and amide resin may be used according to the purpose of the utility. Especially, when the relief pattern of the present invention is applied to outdoor fittings, photopolymerizable acrylic resin is most suitable in view of its weather resistance and durability. The term "photo-polymerizable acrylic resin" means the polymer containing ethylenically unsaturated monomer having hydroxyl group, such as the acrylic resin having two or more of ethylenically unsaturated double bonds being linked by urethane bonds which is obtainable from the reaction system of tolylene diisocyanate and ethylenically unsaturated compound having hydroxyl group. Further, the above-mentioned weak alkali-soluble resin is the resin composition which containing unsaturated groups of 200 to 5,000, preferably 300 to 1,500 in unsaturation equivalent, for example, (1) a composition containing prepolymer of 50 to 300 in acid value and having two or more of ethylenically unsaturated bond portions which are linked by carboxyl group and urethane bond obtained through the reaction system of hydroxycarboxylic acid, diisocyanate and/or triisocyanate and ethylenically unsaturated compound having hydroxyl group, (2) a composition containing acrylic resin of 50 to 200 in acid value having ethylenically unsaturated bond portion which is linked to the main chain by way of urethane bond and containing, as a copolymer component, ethylenically unsaturated carboxylic acid, (3) a composition of a mixture of said (1) and (2).

As the photosensitizers, Michler's ketone, benzoin, N,N-dibutyl-p-nitrosoaniline, benzoin methyl ether, $\alpha$-methyl benzoin, $\alpha$-phenyl benzoin and diacetyl are used, and the addition amount thereof is in the range of 0.1 to 10% by weight.

In case the photosensitive resin layer under this pattern forming layer is colored, and multi-coloring of the relief pattern is not required, this pattern forming layer can be omitted.

The photosensitive resin layer of the photosensitive sheet of the present invention will now be explained. This resin layer may be formed on the combined photosensitive sheet of said photo-pervious base film, photo-impervious ink layer, releasing layer and pattern forming layer, or formed directly on the surface of the substrate to be treated. The thickness of this photosensitive resin layer may be in the range of about 10 to 80 $\mu$, and preferably 15 to 60 $\mu$. If the thickness is more than 80 $\mu$, the actinic rays cannot reach the deepest portion of the layer and evaporation of the solvent of the composition becomes difficult, so that defective portions are sometimes caused in the obtained relief pattern. While, if the thickness is less than about 10 $\mu$, the relief feeling of the pattern is lost to reduce the decorative effect.

This photosensitive resin layer is a photo-curable coating composition mainly containing photo-curable and alkali-soluble resin and photosensitizer. Further, if necessary, coloring pigment may be added to said photo-curable coating composition.

As the photo-curable coating composition of the present invention, it is necessary that the composition cured by the application of ultraviolet rays must be tightly adhered to the surface of substrate and be excellent in several properties such as chemical resistance, solvent resistance and weather resistance. It is possible to obtain these properties by using the photocurable coating composition of the present invention. The film of the composition before curing by the ultraviolet rays is preferably soluble in weak alkaline solutions. When the photo-curable coating composition has such characteristics and contains alkali-soluble photo-curable resin, any kind of resin may be employed. Photosensitive resins used for the above-mentioned photo-curable coloring ink having an unsaturation equivalent of 200 to 5,000, and preferably 300 to 1,500 can be used.

In view of fires or virulences in the use of organic solvents, the photo-curable composition is preferably water- or alkali-soluble and good in adherence to the surface of substrate (including coated surface). As disclosed in the foregoing paragraph, the acid value of this composition may be 30 to 200. When the acid value is lower than 30, the adherence to the substrate becomes worse and the development of the pattern, i.e. curing becomes difficult, and when the acid value is higher than 200, the water resistance of the obtained relief pattern becomes worse. In view of the development by a weak alkali washing solution, the adherence to the substrate and the water resistance of the relief pattern, the acid value of the photo-curable composition is preferably in the range of 50 to 100. The regard to the above-mentioned unsaturation equivalent, when it is less than 200, the film forming becomes worse, and when it exceeds 5,000, the photo-curing property becomes worse. Therefore, the range of unsaturation equivalent may be 200 to 5,000, and the range of 300 to 1,500 is preferable. Further, as disclosed in the above, for example, Michler's ketone, benzoin, N,N-dibutyl-p-nitrosoaniline, benzoin methyl ether, $\alpha$-methyl benzoin, $\alpha$-phenyl benzoin and diacetyl can be used as the photosensitizers, and the amount thereof may be in the range of about 0.1 to 10% by weight.

In order to form the photosensitive resin layer of the present invention, the photosensitive resin composition is applied to the surface of a combined sheet of the photopervious base film, photo-impervious ink layer, releasing layer and pattern forming layer, or to the surface of the substrate separately, and the solvent in the composition is then evaporated by heat rays.

In the method for forming relief patterns of the present invention, the above-mentioned photo-pervious base film, photo-impervious ink layer, releasing layer, pattern forming layer and photosensitive resin layer are put together in layers on the surface of the substrate to be treated, and said layers are applied with actinic rays such as ultraviolet rays. The actinic rays are thereby transmitted to the photosensitive resin layer in the pattern portion, while the rays in the portion other than the pattern portion are interrupted by the photo-impervious ink layer, so that the pattern forming layer and the photosensitive resin layer in the pattern portion are cured while the resin layer in the remaining portion is not cured. As the source of ultraviolet rays, an ultra-high pressure mercury lamp of 1 kw to 10 kw is most desirable. Chemical lamps, sunrays and arc lamps may also be employed, however, the intensity of light thereof is somewhat small in order to pass through the pattern forming layer. Further, it is desirable that the intensity of the ultraviolet rays at 365 m$\mu$ in wave length in more than 100 w/m$^2$ and rays of more than 1,000 w/m$^2$ is undesirable because it is apprehended that the photo-sensitive sheet and the substrate are sometimes damaged by the large amount of heat rays.

After the photo-curing of the pattern forming layer and the photosensitive resin layer, the upper layers of the photo-pervious base film and the photo-impervious ink layer are peeled off at the releasing layer by pulling open one end. The development of the relief pattern is then carried out by spraying a weak alkaline solution to the remaining layers on the surface of substrate, thereby washing away the un-cured portions of the photosensitive resin layer. As the weak alkaline solutions, any solution which give water-solubility to free carboxylic acid by neutralization such as aqueous solution of sodium hydroxide, sodium carbonate, potassium hydroxide and ammonia can be used. For example, when aqueous sodium hydroxide solution is used, a solution of 0.1% to 5% is suitable. When the concentration is less than 0.1%, development becomes difficult, and when the concentration is more than 5%, the resin of the pattern is sometimes damaged.

The thus formed pattern has smooth surface and relief feeling. In addition, it has excellent durability and lively feeling which have never been produced through the conventional art.

Referring now to the drawings, especially to FIG. 1 to FIG. 4, inclusive, there is illustrated one embodiment of the present invention. The photosensitive sheet comprises a photo-pervious base film 1, a photo-impervious ink layer 2, a releasing layer 3, a coloring ink layer (pattern forming layer) 4 and a photosensitive resin layer 5, which is allowed to adhere on the surface of a substrate 6 under pressure (see FIG. 1). Then, the photosensitive sheet is applied with ultraviolet rays (UV) to produce latent images 5a under the portions other than the photo-impervious ink layer 2 (see FIG. 2). After the application of the ultraviolet rays, the upper layers of the photo-pervious base film 1, photo-impervious ink layer 2 and releasing layer 3 are peeled off from the coloring ink layer 4 and photosensitive resin layer 5 on the substrate (see FIG. 3), and the portions other than the latent images 5a of the photosensitive resin layer are washed away by using a weak alkaline solution to leave the relief pattern of the invention consisting of said coloring ink layer 4 and cured photosensitive resin layer 5a.

Figure 5:
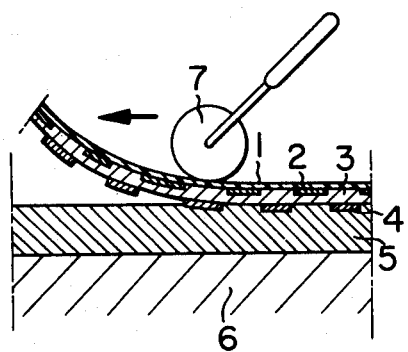
FIG. 5 is also schematic cross-sectional view of a photosensitive sheet and a substrate showing another process of the present invention.

In the other embodiment as shown in FIG. 5, the photo-sensitive sheet of the present invention comprises a photo-pervious base film 1, a photo-impervious ink layer 2, a releasing layer 3 and a coloring ink layer (pattern forming layer) 4, while being different from the foregoing embodiment, a photosensitive resin layer 5 is previously applied to the surface of the substrate 6 (see FIG. 5). It will, however, be understood that when the photosensitive sheet of this embodiment is allowed to adhere on the surface of the photosensitive resin layer 5 on the substrate 6, the layer formation becomes just like that shown in the above-mentioned FIG. 2. Therefore, this method is only a modification of the foregoing embodiment, and this coating of the photosensitive resin layer 5 to the surface of the substrate 6 is carried out according to the convenience of the treatment process, while the steps after the attaching of the photosensitive sheet such as the photo-curing and washing may be carried out in like manner as the above embodiment as shown by FIGS. 1 to 4.

The features of the present invention will be now further explained in the following by several Examples with reference to the drawings.

EXAMPLE 1

The surface of polypropylene film 1 of 25 $\mu$in thickness was treated by corona discharge, and a photo-impervious ink layer 2 was formed on the portions other tha the pattern portion by printing with a black oil ink, which constituted a negative pattern. Said oil ink was prepared by dispersing 20 parts by weight of carbon black into 80 parts by weight of oil varnish obtained by treating purified linseed oil at a temperature of about 300° C. Casein was partially neutralized to pH 7 with ammonia, and 1% by weight of silicone (trade mark: Toray Silicone DC-6) to the nonvolatile matter of said casein was then added to obtain a releasing agent. This agent was diluted to 5% by weight by using a water-ethanol solvent (ratio: 7/3). Then, the releasing agent solution was applied on the surface of said printed film to form a layer of 3 $\mu$ in thickness, and thereby the releasing layer 3 was formed. Then, a multicolor ink layer 4 was applied to the surface of said releasing layer 3 only in the transparent pattern portion by gravure printing method using photo-curable color inks.

The above-mentioned photo-curable inks were made as follows. A polymer solution was prepared from a monomer composition of 30 parts by weight of styrene, 25 parts by weight of butylmethacrylate, 15 parts by weight of butylacrylate, 30 parts by weight of 2-hydroxyethyl methacrylate, 2 parts by weight of azoisobutyronitrile as a polymerization initiator and 100 parts by weight of methyl isobutyl ketone as a solvent. 45 g of an equimolar adduct of tolylene diisocyanate and 2-hydroxyethyl methacrylate was added to 200 g of said polymer solution, and then caused to react to produce a polymerizable unsaturated resin (acid value: 1, unsaturation equivalent: 1,000). Further, 120 parts by weight of ethyl alcohol was added to the above polymerizable unsaturated resin to obtain a photosensitive resin solution containing 40% of solid material, and 3% by weight of benzoin ethyl ether against the solid content was further added as a photo-sensitizer. Then, 10 parts by weight of carbon black, 50 parts by weight of Cyanine Blue 5030 S(trade mark of DAINIPPON INK & CHEMICALS INC. for organic blue pigment), 50 parts by weight of Fuji Fast Red 3300 E (trade mark of FUJI SHIKISO CO., LTD. for organic red pigment) and 100 parts by weight of Chrome Yellow 5G (trade mark of KIKUCHI PIGMENT MFG. CO.,LTD. for inorganic yellow pigment) was well dispersed to each 100 parts by weight of the solid content of said photosensitive resin solution.

30 g of an equimolar adduct of tolylene diisocyanate and 2-hydroxyethyl methacrylate was added to 200 g of polymerization product of 15 parts by weight of acrylic acid, 15 parts by weight of 2-hydroxyethyl methacrylate, 35 parts by weight of ethylacrylate, 35 parts by weight of methylmethacrylate, 2 parts by weight of azoisobutyronitrile as a polymerization initiator and 100 parts by weight of dioxane as a solvent, and this mixture was caused to react to obtain a polymerizable unsaturated resin (resin acid value: 89, unsaturation equivalent: about 1,300, solid content: 56.5%). Then, 1% by weight of benzoin ethyl ether as a photo-sensitizer was added to said resin product to obtain a clear photosensitive resin composition. The whole surfaces of the multicolor ink layer 4 and the exposed portion of the releasing layer 3 were applied with this resin composition so as to form a layer of 20 to 30 $\mu$ in dry thickness, and after leaving for about 15 minutes in the shade, it was dried.

This photosensitive sheet was applied to a surface portion of a door of an automobile (substrate) 6 by using a hand roller 7 (see FIG. 1). Then, ultraviolet radiation was applied to said photosensitive sheet on the substrate for 5 minutes by using a 2 kw high pressure mercury lamp placed at a distance of 30 cm to produce latent images 5a (see FIG. 2). Thereafter, the upper base film was peeled off from the substrate; the multicolor ink layer 4 and photosensitive resin layer 5 were transferred to the surface of the door 6, while the peeled base film was like a negative film (see FIG. 3).

The un-cured portion (un-exposed portion) of the photosensitive resin layer 5 was then washed away by 0.2% sodium hydroxide aqueous solution, and thereby colored relief pattern 4 and 5a of about 30 to 40 $\mu$ in thickness was formed. (see FIG. 4).

This relief pattern was further dried for 30 minutes at 60° C, and a lacquer coating of about 20 to 30 $\mu$ was applied on the relief pattern portion, and thereafter it was subjected to forced drying in an infrared oven.

Though the above process, a multicolored relief pattern in good quality was formed. This pattern was subjected to the tests of 1,000 hours in a Sunshine weather-ometer and 10 cycles of intermittent temperature cycle (−20 C for one hour plus +60° C for one hour per one cycle), and no changes such as cracks, peeling and yellowing were observed.

EXAMPLE 2

The surface of polypropylene film 1 of 25 $\mu$ in thickness was treated by corona discharge, and a photo-impervious ink layer 2 was formed on the portions other than the pattern portion by printing with a gravure ink, which constituted a negative pattern. Said gravure ink was prepared by dispersing 15 parts by weight of carbon black with 85 parts of a 42% toluene solution of phenol resin modified with resin. A releasing layer 3 was formed in like manner as in Example 1. After fully drying the releasing layer 3, a multicolor ink layer 4 was formed by the gravure printing method using photo-curable color inks on the transparent pattern portion of the releasing layer 3.

Said photo-curable inks were made by the process as follows. A polymer solution was prepared from a monomer composition of 12 parts by weight of acrylic acid, 18 parts by weight of styrene, 25 parts by weight of butylmethyacrylate, 15 parts by weight of butylacrylate, 30 parts by weight of 2-hydroxyethyl methacrylate, 2 parts by weight of azoisobutyronitrile as a polymerization initiator and 100 parts by weight of dioxane as a solvent. Then 45 g of an equimolar adduct of tolylene diisocyanate and 2-hydroxyethyl methacrylate was added to 200 g of said polymer solution and was caused to react to produce a polymerizable unsaturated resin (acid value: 65, unsaturation equivalent: 1,000). Furhter, 120 parts by weight of ethyl alcohol was added to the above polymerizable unsaturated resin to obtain a photosensitive resin solution containing 40% of solid content, and then 3% by weight of benzoin ethyl ether against said solid content was added as a photosensitizer. Thereafter, 10 parts by weight of carbon black 50 parts by weight of Cyanine Blue 5030 S (trade mark of DAINIPPON INK & CHEMICALS INC. for organic blue pigment), 50 parts by weight of Fuji Fast Red 3300 E (trade mark of FUJI SHIKISO CO., LTD. for organic red pigment) and 100 parts by weight of Chrome Yellow 5G (trade mark of KIKUCHI PIGMENT MFG. CO., LTD. for inorganic yellow pigment) as well dispersed to each 100 parts by weight of the solid content in said photosensitive resin solution.

A photosensitive resin layer 5 of about 30 to 40 $\mu$ in thickness was formed on the whole surfaces of the multicolor ink and the exposed portion of the releasing layer 3, in which the material for this photosensitive resin layer was prepared by the process as follows. In the first step, 26.8 g of $\alpha,\alpha$-dihydroxymethyl propionic acid and 121.6 g of an equimolar adduct of tolylene diisocyanate and 2-hydroxyethyl methacrylate were caused to react at 80° C for 5 hours in the presence of dioxane so as to produce a 50% solution of reaction product. The unsaturation equivalent of the obtained resin content was 380 and acid value was 75. An acrylic resin (number average molecular weight: about 3,500; 50% solution of toluene/butanol=1/1 mixture) was prepared by solution polymerization from 25% by weight of acrylic acid, 25% by weight of ethylacrylate and 50% by weight of methylmethacrylate. Then, 100 g of the above resin product dioxane solution, 60 g of the above acrylic resin solution and 100 g of a 20% solution of cellulose acetate butylate in ethyl alcohol were mixed together, and 1 g of benzoin ethyl ether as a photosensitizer was further added to this mixture to obtain a clear varnish. After the coating of this clear varnish, it was allowed to stand for about 15 minutes in the shade, and further dried for 15 minutes at 60° C.

The photosensitive sheet formed through the above-mentioned process was allowed to adhere on the surface of an aluminum plate 6 of 0.1 mm in thickness by using a motor roller, and irradiated with ultraviolet rays for 5 minutes by using a 2 kw high pressure mercury lamp placed 30 cm distant. After this irradiation, the negative base film of upper layers was peeled off. Then the transferred resin layer on the aluminum plate was washed with 0.2% aqueous solution of sodium hydroxide, and thereby a multicolored relief pattern 4 and 5a of about 20 to 30 $\mu$ in thickness was formed. This pattern was further dried at 100° C for 30 minutes. The pattern was still embossed for about 20 to 30 $\mu$ from the surface of aluminum substrate and the adherence to the aluminum surface was excellent. Thereafter, a thermosetting acrylic resin varnish of 20 to 30 $\mu$ in thickness was applied to the whole surface of said aluminum plate, and dried at 140° C for 30 minutes, and thus a finely decorative relief pattern with brilliant gloss was formed on the surface.

In the tests of the coating properties of this finished surface, 2,000 hours to Sunshine weather-ometer and 20 cycles of intermittent temperature cycle (−20° C for one hour plus +60° C for one hour per one cycle) were carried out. No cracking, peeling or yellowing was observed.

EXAMPLE 3

The surface of polyproylene film 1 of 25 $\mu$ in thickness was treated by corona discharge, and a photo-impervious ink layer 2 was formed on the portion other than the pattern portion by printing with an black oil ink used in Example 1, and thereby a negative pattern was formed. In the next step, the solution of releasing agent obtained in Example 1 was applied to the surface of said printed film to form a releasing layer 3 of about 2 $\mu$ in thickness. After fully drying said releasing layer 3, a multicolor ink layer 4 was formed on the transparent portion (pattern portion) of said releasing layer 3 by the gravure printing method, and thereby a photosensitive sheet of the present invention was made. The inks used for the above multicolor ink layer 4 were prepared in like manner as the photo-curable inks in the foregoing Example 3.

Then a photosensitive resin composition was prepared in like manner as the foregoing Example 1, and this composition was applied to a portion of a door of an automobile so as to form dried film of 30 to 40 $\mu$ in thickness. After the coating, the coated surface was left in the shade for 15 minutes, and further dried for 15 minutes at 60° C to form a photosensitive resin layer 5.

In the next step, the above-mentioned photosensitive sheet was adhered to the surface of said photosensitive resin layer 5 on the door 6 by using a rubber hand roller 7 (see FIG. 5). Then ultraviolet radiation was applied to said photosensitive sheet for 5 minutes by using a 2 kw high pressure mercury lamp placed at a position of 30 cm distant (see FIG. 2). After this irradiation, the base film of the photosensitive sheet was peeled off which was like a negative film, and the multicolor ink layer 4 was transferred to the surface of the photosensitive resin layer 5 on the door 6 (see FIG. 3). Then, a 2% aqueous solution of sodium hydroxide was sprayed to the layers of ink 4 and photosensitive resin 5 so as to wash off the un-cured portions, and thereby a multicolored relief pattern 4 and 5a of about 30 to 40 $\mu$ in thickness was formed on the surface of the door 6 (see FIG. 4).

This relief pattern was then dried at 60° C for 30 minutes, about 20 to 30 $\mu$ thick coating of lacquer was applied on said relief pattern, and then it was subjected to forced drying in an infrared oven. Thus, a fine relief pattern was formed. This relief pattern was further tested by a Sunshine weather-ometer for 1,000 hours and 10 cycles of intermittent temperature cycle (−20° C for one hour plus +60° C for one hour per one cycle), and as the result, no cracking, peeling or yellowing was noted.

EXAMPLE 4

A combined sheet of polypropylene film 1, a photo-impervious ink layer 2 ad releasing layer 3 was prepared in the same manner as Example 3. The thickness of the releasing layer 3 was made 3 μ in this example. After sufficiently drying the releasing layer 3, a multicolor ink layer 4 was printed on the transparent pattern portion of said releasing layer 3 by the gravure printing method using photo-curable inks, and thereby a photosensitive sheet of the present invention was made. The photo-curable multicolor inks as used herein were prepared in the same manner as the foregoing Example 2.

In the meantime, a photosensitive resin composition was prepared in the same manner as Example 2. Then, this composition was applied to the surface of an aluminum plate 6 of 0.1 mm in thickness to form a photosensitive resin layer 5 of about 30 to 40 μ in dried thickness, the plate 6 with the photosensitive resin layer 5 was kept in the shade for 15 minutes and dried at 60° C for a further 15 minutes.

In the next step, the above photosensitive sheet was applied to the surface of said photosensitive resin layer 5 on the aluminum plate 6 by using a motor roller. Thereafter, ultraviolet radiation was applied to said photosensitive sheet 5 for 5 minutes by using a 2 kw high pressure mercury lamp placed at a position 30 cm distant. Then the negative base film was peeled off and a 2% aqueous solution of sodium hydroxide was sprayed on the transferred ink layer 4 and photosensitive resin layer 5 so as to wash away the un-cured portions thereof. Thereby a multicolored pattern of 20 to 30 μ in thickness with relief feeling 4 and 5a was formed on the aluminum substrate. This pattern was further dried for 30 minutes at 100° C, and it was observed that the pattern was clearly embossed for about 20 to 30 μ from the aluminum surface and the adherence to the aluminum surface was also good. After this drying, a 20 to 30 μ coating of thermosetting acrylic resin vernish was applied to the whole surface of said treated aluminum plate and cured at 140° C for 30 minutes, and thereby a fine decorative effect with brilliant gloss was attained.

As the result of tests by a Sunshine weather-ometer for 2,000 hours and 20 cycles of intermittent temperature cycle (−20° C for one hour plus +60° C for one hour per one cycle), changes such as cracking, peeling and yellowing were not observed.

According to the above-described Examples, it will be understood that the method for forming relief patterns of the present invention is excellent. It should be emphasized, however, that the specific embodiments described and shown are intended as merely illustrative and in no way restrictive of the invention.

What is claimed is:
1. A method for forming a relief pattern on a substrate which comprises the steps of:
    adhering under pressure a photosensitive sheet on the surface of a substrate to be treated, said photosensitive sheet comprising: a photo-pervious base film, a photo-impervious ink layer printed in the part other than desired pattern portion on said photo-pervious base film, a releasing layer, a photosensitive resin layer and a layer of a photo-curable ink in said pattern portion between said releasing layer and photosensitive resin;
    II. radiating actinic rays through said photo-pervious base film on said photosensitive sheet on said substrate to cure said photosensitive resin layer in portions corresponding to said pattern portion;
    III. peeling off the upper layer of said photo-pervious base film, photo-impervious ink layer and releasing layer, while leaving said photosensitive resin layer and said photo-curable ink layer on said substrate; and
    IV. contacting a washing solution with said photosensitive resin layer and said photo-curable ink layer on said substrate to wash away any un-cured portions of said photosensitive resin layer.

2. A method for forming a relief pattern on a substrate as claimed in claim 1, in which said photosensitive resin layer is adhered on the surface of said substrate, and thereafter the remaining portions of said photosensitive sheet are adhered to said photosensitive resin layer.

3. A method for forming a relief pattern on a substrate as claimed in claim 1, in which said photo-pervious base film is made of a plastic film or a cellulose derivative film, and the thickness of said film is within the range of 20 to 200 microns.

4. A method for forming a relief pattern on a substrate as claimed in claim 1, in which said releasing layer is made of a weak alkali-soluble material, and the thickness of said releasing layer is within the range of 1 to 5 microns.

5. A method for forming a relief pattern on a substrate as claimed in claim 1, in which said photosensitive resin layer is made of an alkali-soluble and photo-curable resin and a photosensitizer.

6. A method for forming a relief pattern on a substrate as claimed in claim 1, in which the thickness of said photosensitive resin layer is within the range of 10 to 80 microns.

7. A method for forming a relief pattern on a substrate as claimed in claim 1, in which said actinic rays are ultraviolet rays having an intensity of 100 to 1,000 w/m$^2$ at 365 mμ in wave length.

8. A method for forming a relief pattern on a substrate as claimed in claim 1, in which said washing solution is an aqueous solution of member selected from the group consisting of sodium hydroxide, sodium carbonate, potassium hydroxide and ammonia.

9. A method for forming a relief pattern on a substrate as claimed in claim 1, in which the thickness of said photo-pervious base film is within the range of 20 to 200 microns, said photo-impervious ink has a negative density of at least 2, said releasing layer has a thickness within the range of 1 to 5 microns, said photo-curable inks have a negative density within the range of 0.5 to 1.5, said photosensitive resin layer has a thickness within the range of 10 to 80 microns, wherein said photosensitive resin layer contains 0.1 to 10 weight percent photosensitizer, and wherein said actinic rays are ultraviolet rays having an intensity of 100 to 1,000 w/m$^2$ at 365 mμ in wavelength.

10. A method for forming a relief pattern on a substrate as claimed in claim 1, in which said photosensitive resin layer has a thickness within the range of 15 to 60 microns.

11. A method for forming a relief pattern on a substrate as claimed in claim 1 in which said releasing layer is a weak alkali-soluble material selected from the group consisting of protein, cellulose derivative and polyvinyl alcohol and wherein said photosensitive resin layer is an alkalisoluble and photo-curable resin selected from the group consisting of polyvinyl alcohol-cinnamic ester, acrylic resin-cinnamic ester, acrylate resin, polyamide resin, diazo resin and amide resin having an unsaturation equivalent of 200 to 5,000 and an acid value of 50 to 100.

* * * * *